United States Patent
Shiau

(10) Patent No.: US 6,939,456 B2
(45) Date of Patent: Sep. 6, 2005

(54) MINIATURIZED IMAGE SENSOR MODULE

(75) Inventor: Simon Shiau, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 255 days.

(21) Appl. No.: 10/358,508

(22) Filed: Feb. 4, 2003

(65) Prior Publication Data

US 2004/0149884 A1 Aug. 5, 2004

(51) Int. Cl.[7] .............................................. H01L 27/00
(52) U.S. Cl. ..................... 205/208.1; 358/474; 359/819
(58) Field of Search .............................. 250/208.1, 216, 250/236; 358/474, 484; 359/698, 701, 811, 819, 822, 823, 827

(56) References Cited

U.S. PATENT DOCUMENTS 6,710,945 B1 * 3/2004 Miranda ..................... 359/819
2002/0006687 A1 * 1/2002 Lam .......................... 438/118
2003/0209787 A1 * 11/2003 Kondo et al. ............... 257/673
2004/0113048 A1 * 6/2004 Tu ........................... 250/208.1

* cited by examiner

Primary Examiner—Stephone B. Allen
(74) Attorney, Agent, or Firm—Pro-techtor Int'l Services

(57) ABSTRACT

A miniaturized image sensor module including a substrate, a photosensitive chip, a transparent layer, an injection molded structure, and a lens barrel. The substrate has an upper surface, a lower surface and a slot. The chip is electrically connected to the lower surface of the substrate with a photosensitive region of the chip exposed from the slot. The transparent layer is arranged on the upper surface of the substrate to cover over the slot. The injection molded structure encapsulates and packages the substrate and the chip and is formed with a frame layer on a top of the transparent layer. The frame layer is formed with an internal thread and the lens barrel is formed with an external thread to be screwed to the internal thread. The lens barrel is formed with a chamber and an opening communicating with the chamber. An aspheric lens is also arranged within the chamber.

4 Claims, 2 Drawing Sheets

US 6,939,456 B2

MINIATURIZED IMAGE SENSOR MODULE

BACKGROUND OF THE INVENTION

1. Field of the Invention

The invention relates to a miniaturized image sensor module, and in particular to a miniaturized image sensor module that may be assembled, disassembled, and positioned easily.

2. Description of the Related Art

Referring to FIG. 1, a conventional image sensor module includes a lens holder 10, a lens barrel 20, and an image sensor 30. The lens holder 10 has a top face 12, a bottom face 14 and a chamber 16 penetrating through the lens holder 10 from the top face 12 to the bottom face 14. The chamber 16 of the lens holder 10 is formed with an internal thread 18. The lens barrel 20 is formed with an external thread 22, inserted into the chamber 16 from the top face 12 of the lens holder 10, and screwed to the internal thread 18 of the lens holder 10. The lens barrel 20 is also formed with an opening 24. An aspheric lens 26 is arranged within the chamber 16 and under the opening 24. An infrared filter 28 is also arranged within the chamber and under the aspheric lens 26. The image sensor 30 has a first face 32 and a second face 34. The first face 32 is provided with a transparent layer 36. The transparent layer 36 of the image sensor 30 is adhered to the bottom face 14 of the lens holder 10. The focal lengths between the aspheric lens 26 of the lens barrel 20 and the transparent layer 36 of the image sensor 30 may be controlled by adjusting the screwed length between the lens barrel 20 and the lens holder 10.

However, the lens holder 10 has to be additionally provided to combine with the lens barrel 20 in the module. Thus, the volume of the module may not be reduced and the cost thereof is high. Furthermore, the transparent layer 36 of the image sensor 30 has to be precisely adhered and positioned inside the chamber 16 of the lens holder 10 in order to prevent the received optical signals from shifting. In addition, the thickness of the used image sensor 30 may not be reduced and the overall module cannot be miniaturized.

SUMMARY OF THE INVENTION

An object of the invention is to provide a miniaturized image sensor module.

Another object of the invention is to provide a miniaturized image sensor module, which may be assembled easily and has a reduced manufacturing cost.

To achieve the above-mentioned objects, the invention provides a miniaturized image sensor module including a substrate, a photosensitive chip, a transparent layer, an injection molded structure, and a lens barrel. The substrate has an upper surface, a lower surface and a slot penetrating through the substrate from the upper surface to the lower surface. A plurality of traces is formed on the lower surface and at a periphery of the slot. The photosensitive chip is electrically connected to the lower surface of the substrate with the photosensitive region of the chip exposed from the slot of the substrate. The transparent layer is arranged on the upper surface of the substrate to cover over the slot. The injection molded structure encapsulates and packages the substrate and the photosensitive chip and is formed with a frame layer on a top of the transparent layer. The frame layer is formed with an internal thread and the lens barrel is formed with an external thread to be screwed to the internal thread of the frame layer. The lens barrel is formed with a chamber at a central portion thereof and an opening communicating with the chamber. An aspheric lens is also arranged within the chamber.

DETAILED DESCRIPTION OF THE INVENTION

Figure 1:
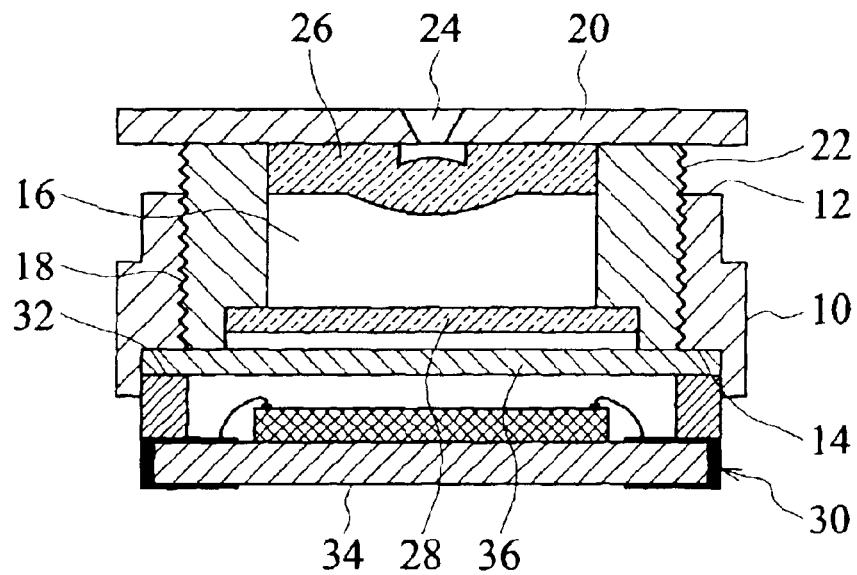
FIG. 1 is a cross-sectional view showing a conventional image sensor module.
Figure 2:
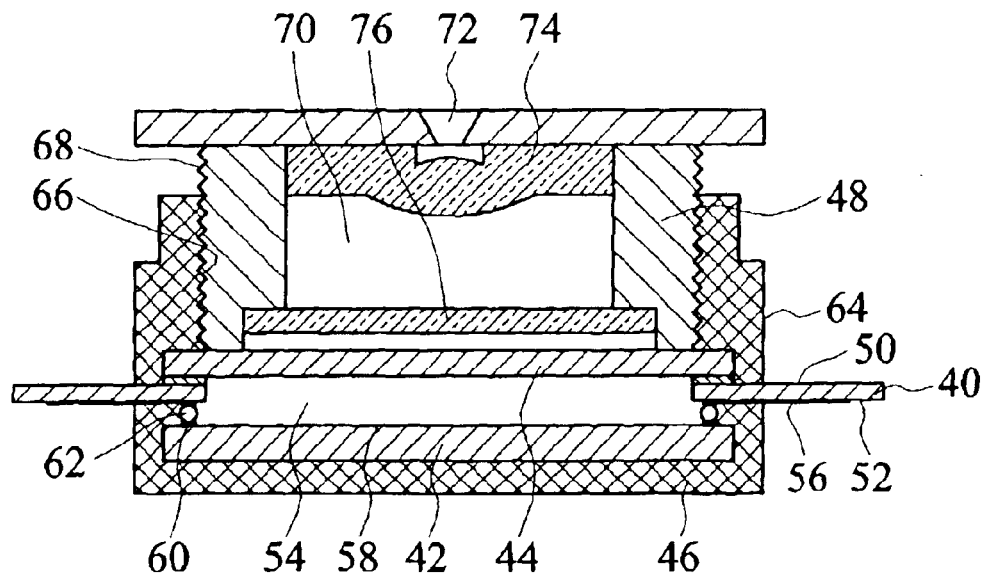
FIG. 2 is a cross-sectional view showing a miniaturized image sensor module of the invention.

Referring to FIG. 2, a miniaturized image sensor module of the invention includes a substrate 40, a photosensitive chip 42, a transparent layer 44, an injection molded structure 46 and a lens barrel 48.

The substrate 40 has an upper surface 50, a lower surface 52 and a slot 54 penetrating through the substrate 40 from the upper surface 50 to the lower surface 52. A plurality of traces 56 is formed on the lower surface 52 and at a periphery of the slot 54.

The photosensitive chip 42 has a photosensitive region 58 and a plurality of bonding pads 60 formed at a periphery of the photosensitive region 58. Projections 62 are formed on the bonding pads 60, respectively. The photosensitive chip 42 is electrically connected to the traces 56 on the lower surface 52 of the substrate 40 in a flip chip manner with the photosensitive region 58 exposed from the slot 54 of the substrate 40.

The transparent layer 44 is a piece of transparent glass arranged on the upper surface 50 of the substrate 40 to cover over the slot 54. Then, the photosensitive chip 42 may receive optical signals passing through the slot 54 and the transparent layer 44.

The injection molded structure 46 is made of an industrial plastic by way of injection molding to encapsulate and package the substrate 40 and the photosensitive chip 42, and to form a frame layer 64 on a top of the transparent layer 44. The frame layer 64 is formed with an internal thread 66.

The lens barrel 48 is formed with an external thread 68, which is screwed to the internal thread 66 of the frame layer 64. The lens barrel 48 is also formed with a chamber 70 at a central portion thereof, and an opening 72 communicating with the chamber 70. An aspheric lens 74 is arranged within the chamber 70 and below the opening 72, and an infrared filter 76 is arranged within the chamber 70 and below the aspheric lens 74.

Figure 3:
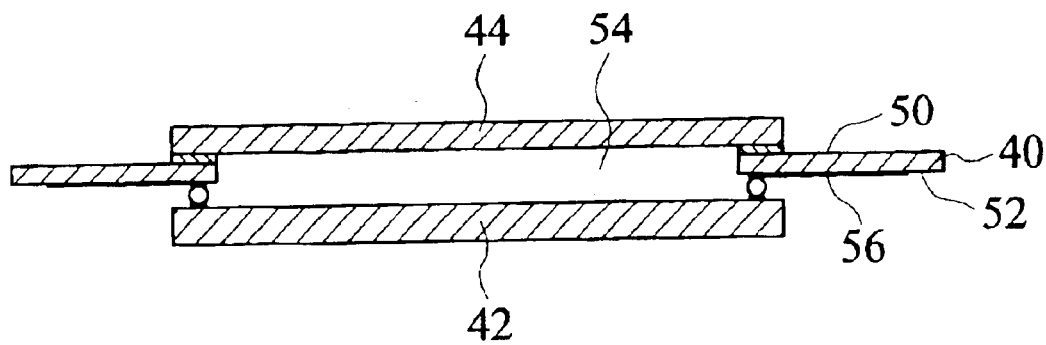
FIG. 3 is a first schematic illustration showing the miniaturized image sensor module of the invention during the manufacturing processes.

The method for manufacturing the miniaturized image sensor module of the invention will be described with reference to FIGS. 3 and 4. As shown in FIG. 3, a substrate 40 is first provided. The substrate 40 has an upper surface 50, a lower surface 52 and a slot 54 penetrating through the substrate 40 from the upper surface 50 to the lower surface 52. A plurality of traces 56 is formed on the lower surface 52 and at a periphery of the slot 54. Then, a photosensitive chip 42 is electrically connected to the lower surface 52 of the substrate 40 in a flip chip manner. Next, a transparent layer 44 is arranged on the upper surface 50 of the substrate 40 to form a new image sensor.

Figure 4:
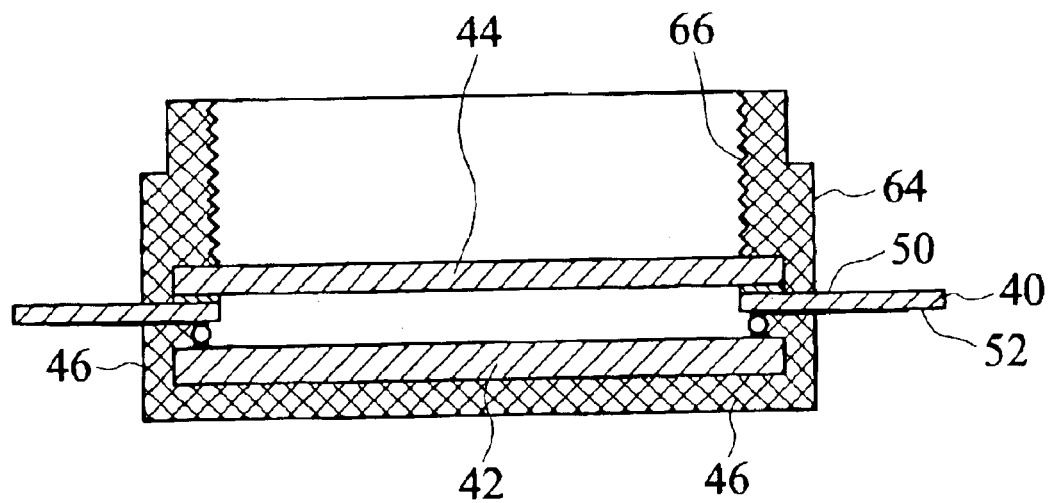
FIG. 4 is a second schematic illustration showing the miniaturized image sensor module of the invention during the manufacturing processes.

Therefore, as shown in FIG. 4, an injection molded structure 46 is formed to encapsulate and package the image sensor of FIG. 3 by way of injection molding using an industrial plastic. The photosensitive chip 42 and the substrate 40 are encapsulated. In addition, the injection molded structure 46 is also formed with a frame layer 64 on the top of the transparent layer 44. During the injection molding process, the frame layer 64 is also formed with an internal thread 66. At this time, the lens barrel 48 may be screwed to the frame layer 64, and the assembling processes of the module of the invention are completed.

The miniaturized image sensor module of the invention has the following advantages.

1. Since a slot 54 is formed in the substrate 40 and the photosensitive chip 42 may receive optical signals passing through the slot 54, the thickness of the image sensor may be reduced, and the module may be miniaturized.

2. Since the frame layer 64 for packaging the photosensitive chip 42 is formed on the image sensor by way of injection molding, the manufacturing processes may be simplified.

3. Since the internal thread 66 is formed in the frame layer 64 during the injection molding process, the frame layer 64 may function as a conventional lens holder and the lens barrel may be screwed to the frame layer 64. In addition, the processes for assembling the module may be more convenient and the manufacturing cost of the module may be effectively lowered.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

What is claimed is:

1. A miniaturized image sensor module, comprising:

a substrate having an upper surface, a lower surface and a slot penetrating through the substrate from the upper surface to the lower surface, a plurality of traces being formed on the lower surface and at a periphery of the slot, a photosensitive chip having a photosensitive region and a plurality of bonding pads formed at a periphery of the photosensitive region, the plurality of bonding pads being electrically connected to the plurality of traces on the lower surface of the substrate, and the photosensitive region being exposed from the slot of the substrate;

a transparent layer arranged on the upper surface of the substrate to cover over the slot;

an injection molded structure for encapsulating and packaging the substrate and the photosensitive chip, the injection molded structure being formed with a frame layer on a top of the transparent layer, and the frame layer being formed with an internal thread; and a lens barrel formed with an external thread to be screwed to the internal thread of the frame layer, the lens barrel being formed with a chamber at a central portion thereof and an opening communicating with the chamber, and an aspheric lens being arranged within the chamber.

2. The miniaturized image sensor module according to claim 1, wherein the bonding pads of the photosensitive chip are formed with projections, which are electrically connected to the traces of the substrate in a flip chip manner.

3. The miniaturized image sensor module according to claim 1, wherein the transparent layer is a piece of transparent glass.

4. The miniaturized image sensor module according to claim 1, further comprising an infrared filter arranged within the chamber of the lens barrel.

* * * * *